United States Patent
Okabe et al.

(10) Patent No.: US 8,888,087 B2
(45) Date of Patent: Nov. 18, 2014

(54) SUSCEPTOR SUPPORT PORTION AND EPITAXIAL GROWTH APPARATUS INCLUDING SUSCEPTOR SUPPORT PORTION

(71) Applicant: Applied Materials, Inc., Santa Clara, CA (US)

(72) Inventors: Akira Okabe, Ohmura (JP); Yoshinobu Mori, Ohmura (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/927,553

(22) Filed: Jun. 26, 2013

(65) Prior Publication Data
US 2014/0290573 A1 Oct. 2, 2014

(30) Foreign Application Priority Data
Mar. 27, 2013 (JP) .................... 2013-066897

(51) Int. Cl.
*H01L 21/683* (2006.01)
*H01L 21/02* (2006.01)
(52) U.S. Cl.
CPC ....... *H01L 21/02617* (2013.01); *Y10S 269/903* (2013.01)
USPC ..................... 269/289 R; 269/903

(58) Field of Classification Search
CPC .................................. H01L 21/68742
USPC ................ 269/289 R, 21, 903; 414/941
See application file for complete search history.

(56) References Cited

U.S. PATENT DOCUMENTS

| | | | | |
|---|---|---|---|---|
| 5,421,893 A * | 6/1995 | Perlov | ............................ | 118/725 |
| 5,516,367 A * | 5/1996 | Lei et al. | ........................ | 118/725 |
| 6,063,196 A * | 5/2000 | Li et al. | ........................... | 118/712 |
| 6,190,113 B1 * | 2/2001 | Bui et al. | ........................ | 414/672 |
| 6,305,677 B1 * | 10/2001 | Lenz | ................................ | 269/13 |
| 7,332,691 B2 * | 2/2008 | Choi et al. | ..................... | 219/390 |
| 2003/0015141 A1 * | 1/2003 | Takagi | ........................... | 118/728 |
| 2003/0178145 A1 * | 9/2003 | Anderson et al. | ......... | 156/345.51 |

* cited by examiner

*Primary Examiner* — Lee D Wilson
*Assistant Examiner* — Tyrone V Hall, Jr.

(57) ABSTRACT

A susceptor support portion of the present invention includes a susceptor shaft and a substrate lift portion. The susceptor shaft includes a support column and a plurality of arms that extend radially from the support column, the substrate lift portion includes a support column and a plurality of arms that extend radially from the support column, the arm of the susceptor shaft includes a first arm, a second arm coupled to the first arm, and a third arm coupled to the second arm, from the support column side of the susceptor shaft, the second arm being provided with a through hole which passes through the second arm in a vertical direction, and a width of the first arm of the susceptor shaft is smaller than a width of the second arm of the susceptor shaft.

9 Claims, 24 Drawing Sheets

(a)

(b)

SUSCEPTOR SUPPORT PORTION AND EPITAXIAL GROWTH APPARATUS INCLUDING SUSCEPTOR SUPPORT PORTION

BACKGROUND OF THE INVENTION

1. Field of the Invention

The present invention relates to a susceptor support portion for supporting a susceptor used at the time of forming an epitaxial film on the surface of a semiconductor wafer and an epitaxial growth apparatus including the susceptor support portion.

2. Background Art

Generally, epitaxial wafers are manufactured by growing an epitaxial film on a semiconductor wafer, with an epitaxial growth apparatus. The uniformity in the thickness of the epitaxial film is one of qualities of the epitaxial wafer, and a high-quality epitaxial wafer is conditioned on the fact that the distribution of film thickness is in a predetermined range within the surface of the wafer.

Generally, the thickness of an epitaxial film is influenced by the temperature of a semiconductor wafer located below the film. The semiconductor wafer is heated through a susceptor, but a susceptor support portion is present at the rear surface of the susceptor. Due to the presence of the susceptor support portion, a difference occurs between the temperature of a shadowed part of the susceptor support portion of the susceptor, seen from a heating apparatus disposed downward, and the temperature of the other parts, which leads to a problem that the temperature of the entirety of the susceptor does not become uniform.

In this regard, for example, JP-A-10-335435 and JP-A-2011-108765 disclose a technique in which a susceptor support portion is formed of a transparent material such as quartz glass. However, even when the susceptor support portion is formed of a transparent material, it has been difficult to solve the above-mentioned problem.

Further, there is also a problem in that a susceptor is deformed due to exposure to a high-temperature environment, and the temperature of the entirety of the susceptor does not become uniform. In this regard, JP-A-2011-108765 discloses a technique in which a force for supporting a susceptor is strengthened by setting the number of arms of the susceptor support portion to four or more, and the susceptor is prevented from being deformed.

However, an increase in the number of arms of the susceptor support portion leads to an increase in a part shadowed by the susceptor support portion.

SUMMARY OF THE INVENTION

An object of the present invention is to solve the above-mentioned problems, and to provide a susceptor support portion capable of reducing an influence on the heating of a susceptor and sufficiently supporting the susceptor, and an epitaxial growth apparatus capable of manufacturing a high-quality epitaxial wafer by including the susceptor support portion.

According to an embodiment of the present invention, there is provided a susceptor support portion supporting a susceptor from below, within an epitaxial growth apparatus that forms an epitaxial film on a surface of a semiconductor wafer placed on the susceptor having a through hole, the susceptor support portion including: a susceptor shaft that supports the susceptor; and a substrate lift portion that supports the semiconductor wafer, wherein the susceptor shaft includes a support column and a plurality of arms that extend radially from the support column, the substrate lift portion includes a support column and a plurality of arms that extend radially from the support column, the arm of the susceptor shaft includes a first arm, a second arm coupled to the first arm, and a third arm coupled to the second arm, from the support column side of the susceptor support portion, the second arm being provided with a through hole which passes through the second arm in a vertical direction, the arm of the substrate lift portion includes a first arm, a second arm coupled to the first arm, and a pedestal portion coupled to the second arm, from the support column side of the substrate lift portion, a lift pin capable of passing through the through hole of the susceptor shaft and the through hole of the susceptor is provided between the pedestal portion and the semiconductor wafer, and a width of the first arm of the susceptor shaft is smaller than a width of the second arm of the susceptor shaft.

The width of the first arm of the susceptor shaft is preferably equal to or less than a diameter of the through hole of the susceptor shaft.

A width of the third arm of the susceptor shaft is preferably smaller than a width of the second arm of the susceptor shaft.

The width of the third arm of the susceptor shaft is preferably equal to or less than the diameter of the through hole of the susceptor shaft.

A width of the second arm of the substrate lift portion is preferably smaller than the width of the first arm of the substrate lift portion.

The width of the second arm of the substrate lift portion is preferably the same as the width of the first arm of the susceptor shaft.

The support column of the susceptor shaft is preferably provided with a cap that supports the susceptor.

The pedestal portion is preferably provided with a concave portion capable of supporting a lower end of the lift pin.

According to another embodiment of the present invention, there is provided an epitaxial growth apparatus forming an epitaxial film on a surface of a semiconductor wafer placed on a susceptor having a through hole, including: a susceptor support portion that supports the susceptor from below, wherein the susceptor support portion includes a susceptor shaft that supports the susceptor and a substrate lift portion that supports the semiconductor wafer, wherein the susceptor shaft includes a support column and a plurality of arms that extend radially from the support column, the substrate lift portion includes a support column and a plurality of arms that extend radially from the support column, the arm of the susceptor shaft includes a first arm, a second arm coupled to the first arm, and a third arm coupled to the second arm, from the support column side of the susceptor shaft, the second arm being provided with a through hole which passes through the second arm in a vertical direction, the arm of the substrate lift portion includes a first arm, a second arm coupled to the first arm, and a pedestal portion coupled to the second arm, from the support column side of the substrate lift portion, a lift pin capable of passing through the through hole of the susceptor shaft and the through hole of the susceptor is provided between the pedestal portion and the semiconductor wafer, and a width of the first arm of the susceptor shaft is smaller than a width of the second arm of the susceptor shaft.

The susceptor support portion according to the present invention is able to reduce an influence on the heating of the susceptor, and sufficiently support the susceptor. In addition, the epitaxial growth apparatus according to the present invention is able to manufacture a high-quality epitaxial wafer by including the susceptor support portion.

DETAILED DESCRIPTION OF THE INVENTION

An embodiment of a susceptor support portion according to the present invention will be described with reference to the accompanying drawings.

Figure 1:
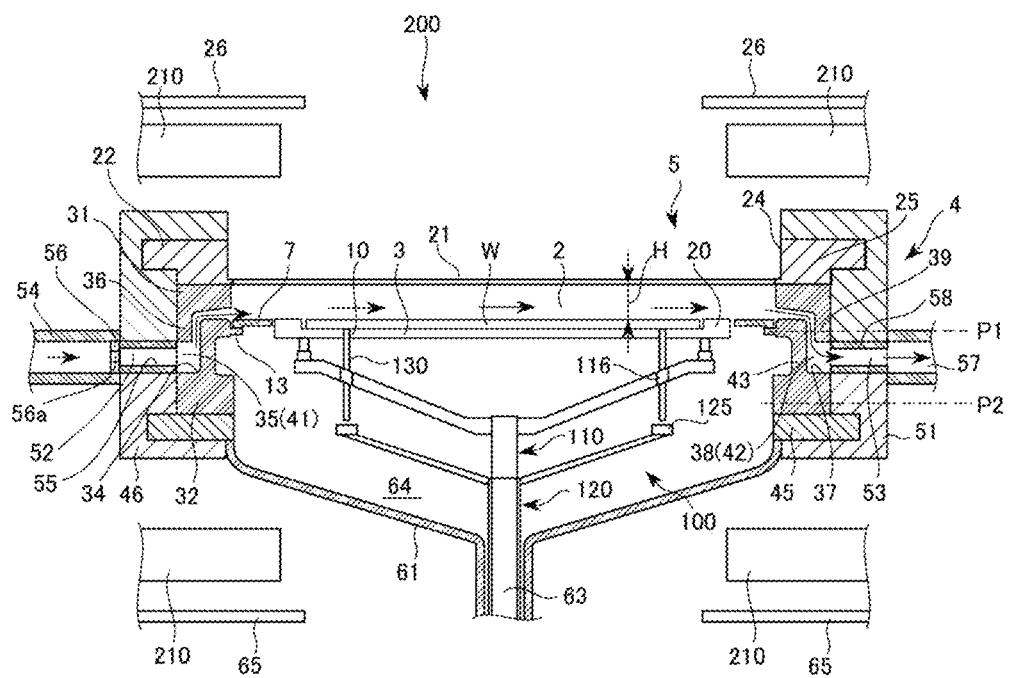
FIG. 1 is a schematic cross-sectional view of an epitaxial growth apparatus according to an embodiment of the present invention.

As shown in FIG. 1, as an example, a susceptor support portion 100 according to the present invention supports a susceptor 20 from below, within an epitaxial growth apparatus 200 that forms an epitaxial film on the surface of a semiconductor wafer W which is placed on the susceptor 20 having through holes 10. The susceptor support portion 100 includes a susceptor shaft 110 that supports the susceptor 20 and a substrate lift portion 120 that supports the semiconductor wafer W. The epitaxial growth apparatus 200 includes heating means 210 such as a halogen lamp at its upper portion and lower portion.

Figure 2:
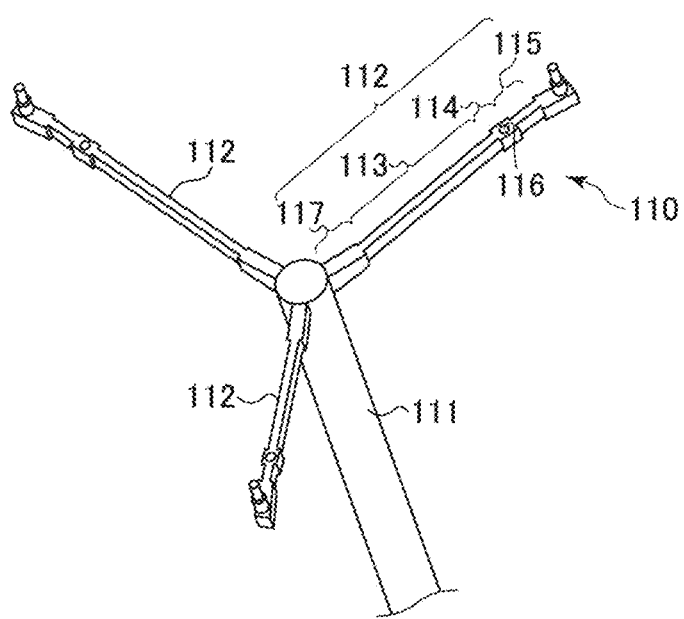
FIG. 2 is a schematic diagram of a susceptor shaft according to the embodiment of the present invention.

As shown in FIG. 2, the susceptor shaft 110 includes a support column 111 and a plurality of arms 112 that extend radially from the support column 111. The arm 112 of the susceptor shaft 110 includes a first arm 113, a second arm 114 coupled to the first arm 113, and a third arm 115 coupled to the second arm 114, from the support column 111 side. The second arm 114 is provided with a through hole 116 which passes through the second arm 114 in a vertical direction.

Figure 3:
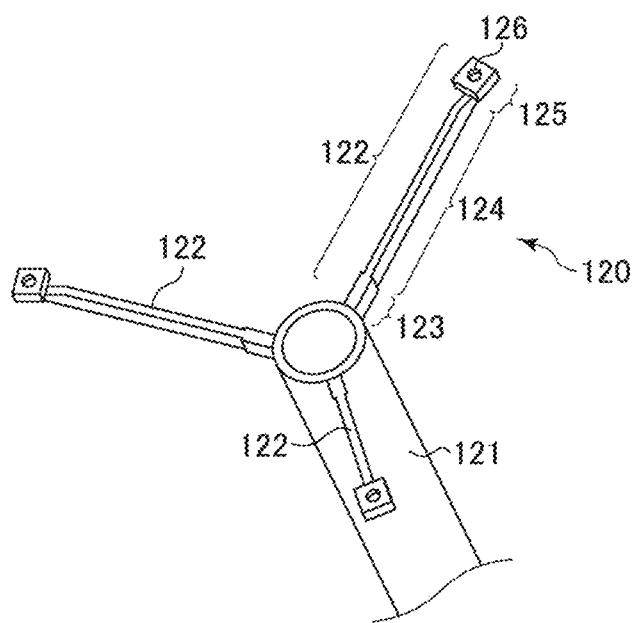
FIG. 3 is a schematic diagram of a substrate lift portion according to the embodiment of the present invention.

In addition, as shown in FIG. 3, the substrate lift portion 120 includes a support column 121 and a plurality of arms 122 that extend radially from the support column. The arm 122 of the substrate lift portion 120 includes a first arm 123, a second arm 124 coupled to the first arm 123, and a pedestal portion 125 coupled to the second arm 124, from the support column 121 side.

As shown in FIGS. 1 to 3, a shank 111 of the susceptor shaft 110 is inserted into a shank 121 of the substrate lift portion 120, and is configured to be capable of vertical motion and rotation.

As shown in FIG. 1, a lift pin 130 capable of passing through the through hole 116 of the susceptor shaft 110 and the through hole 10 of the susceptor 20 is provided between the pedestal portion 125 and the semiconductor wafer W.

In addition, as shown in FIG. 3, it is preferable to provide a concave portion 126 in the pedestal portion 125 of the substrate lift portion 120. The concave portion 126 is provided, and thus it is possible to prevent the lift pin from being inclined due to misalignment, and to lift up a plurality of lift pins at the same level. In addition, it is also possible to prevent the lift pin from being folded.

The semiconductor wafer W can be moved relatively up and down by the above-mentioned lift pin 130. Specifically, the susceptor 20 descends by moving the susceptor shaft 110 downward from the state of FIG. 4A to the state of FIG. 4B. The lift pin 130 passes through the through hole 10 of the susceptor 20, and thus the semiconductor wafer W is lifted up relatively.

Figure 4:
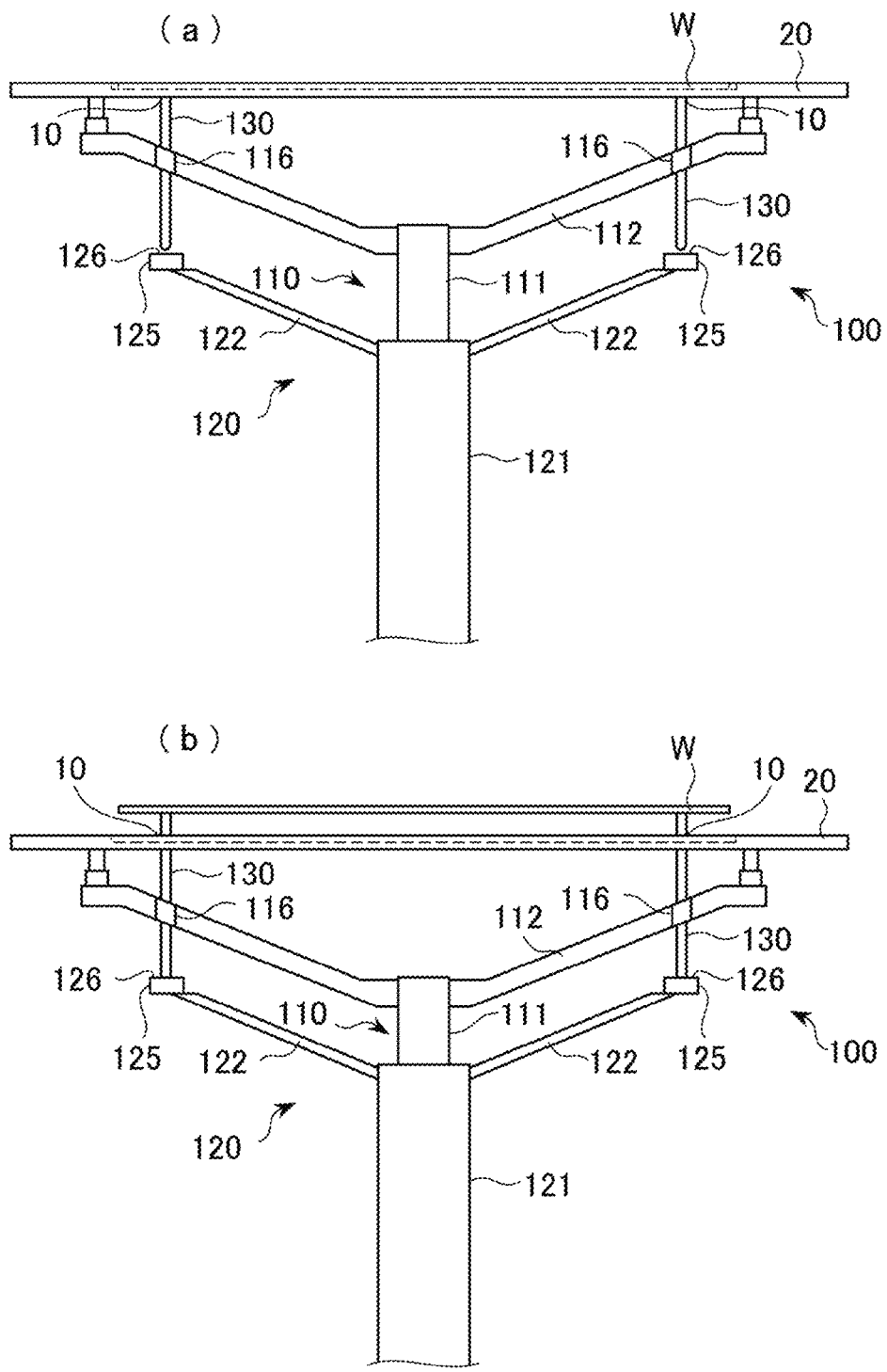
FIGS. 4A and 4B are schematic diagrams illustrating operations of a susceptor support portion according to the embodiment of the present invention.

Reversely, the susceptor 20 ascends by moving the susceptor shaft 110 upward from the state of FIG. 4B to the state of FIG. 4A. The semiconductor wafer W descends relatively, and is placed on the susceptor 20. At this time, the through hole 10 of the susceptor 20 can be formed in a tapered shape or a T-shape having a decreasing diameter downward so that the lift pin 130 does not fall, and the leading end of the lift pin 130 can be formed in a shape corresponding thereto.

As shown in FIG. 2, the susceptor support portion 100 of the present invention is configured such that the width of the first arm 113 of the susceptor shaft 110 is made to be smaller than the width of the second arm 114, thereby allowing the susceptor support portion 100 to reduce the influence on the heating of the susceptor. In addition, the number of arms is not reduce, and thus a force which supports the susceptor is not deteriorated as compared to the susceptor support portion the same number of arms.

In addition, in order to further reduce the influence on the heating of the susceptor, the width of the first arm 113 of the susceptor shaft 110 is preferably set to be equal to or less than the diameter of the through hole 116.

Specifically, the width of the first arm 113 of the susceptor shaft 110 is preferably set to be equal to or more than 3.0 mm and less than 6.3 mm. This is because, when the width is less than 3.0 mm, there is a concern that the susceptor cannot be sufficiently supported, and when the width is equal to or more than 6.3 mm, there is a concern that the influence on the heating of the susceptor may increase.

Similarly, the width of the third arm 115 of the susceptor shaft 110 is preferably set to be smaller than the width of the second arm 114 of the susceptor shaft 110.

Similarly, the width of the third arm 115 of the susceptor shaft 110 is preferably set to be equal to or less than the diameter of the through hole 116 of the susceptor shaft 110.

In addition, as shown in FIG. 3, in order to further reduce the influence on the heating of the susceptor, the width of the second arm 124 of the substrate lift portion 120 is preferably set to be smaller than the width of the first arm 123 of the substrate lift portion 120.

Specifically, the width of the second arm 124 of the substrate lift portion 120 is preferably set to be equal to or more than 2.0 mm and less than 4.8 mm. This is because, when the width is less than 2.0 mm, there is a concern that the lift pin cannot be sufficiently supported, and when the width is equal to or more than 4.8 mm, there is a concern that the influence of the heating of the susceptor may increase.

In addition, the width of the second arm 124 of the substrate lift portion 120 may be set to be the same as the width of the first arm 113 of the susceptor shaft 110.

In addition, as shown in FIG. 2, the susceptor shaft 110 preferably includes an arm 117 on the support column side for coupling these members to each other, between the support column 111 and the first arm 113, and the width of the arm 117 on the support column side is preferably set to be larger than the width of the first arm 113 of the susceptor shaft 110. This is because the coupling of the support column 111 of the susceptor shaft 110 to the arm 112 thereof is strengthened.

In addition, the susceptor shaft 110 and the substrate lift portion 120 are preferably formed of transparent quartz. This is because radiant heat from the heating apparatus 210 can be sufficiently transmitted to the susceptor 20.

Further, a cap for increasing a force which supports the susceptor 20 can also be provided on the upper portion of the support column 111 of the susceptor shaft 110.

Meanwhile, in the drawing, the number of arms is set to three, but can be increased as necessary.

Subsequently, an embodiment of the epitaxial growth apparatus according to the present invention will be described with reference to the accompanying drawings.

As shown in FIG. 1, as an example, the epitaxial growth apparatus 200 according to the present invention forms an epitaxial film on the surface of the semiconductor wafer W which is placed on the susceptor 20 having the through hole 10.

The epitaxial growth apparatus 200 includes a reaction chamber 2. The reaction chamber 2 is constituted by the susceptor 20 on which the substrate W is placed, a sidewall portion 4, and a ceiling portion 5.

The susceptor 20 is a plate-like member having a circular shape in a top surface view, and is configured to be slightly larger than the substrate W. The susceptor 20 is provided with a concave portion 3a for a substrate for placing the substrate W. The susceptor 20 is supported by the susceptor support portion 100 having a plurality of arms.

The susceptor 20 is configured such that an annular susceptor ring 7 is disposed in its periphery at a film forming position P1. The susceptor ring 7 is supported by a flange portion 13 provided in the sidewall portion 4 of the reaction chamber 2.

The ceiling portion 5 is constituted by a ceiling plate 21 and a support portion 22 that supports the ceiling plate 21. The ceiling plate 21 has permeability, and is configured to be capable of heat the inside of the reaction chamber 2 by transmitting heat from the heating means 210 (for example, halogen lamp) and an upper reflector 26 which are provided above the outside of the ceiling plate 21. That is, the epitaxial growth apparatus 200 in the present embodiment is a cold wall-type epitaxial growth apparatus. In the present embodiment, quartz is used as the ceiling plate 21.

The support portion 22 that supports the ceiling plate 21 is annular. The ceiling plate 21 is fixed to the end of a through hole 24 on the substrate W side which is located further inside than the inner edge of the support portion 22. A fixing method includes welding.

The sidewall portion 4 is constituted by an annular upper sidewall portion 31 and an annular lower sidewall portion 32. The above-mentioned flange portion 13 is provided on the inner circumferential side of the lower sidewall portion 32. The support portion 22 is disposed on the upper sidewall portion 31.

A gap 35 between a first concave portion 34 of the lower sidewall portion 32 and a first convex portion 36 of the upper sidewall portion 31 functions as a reactive gas supply passage 41 (supply passage).

Similarly, a gap 38 between a first concave portion 37 of the lower sidewall portion 32 and a first convex portion 39 of the upper sidewall portion 31 functions as a gas exhaust passage 42.

In this manner, the reactive gas supply passage 41 and the gas exhaust passage 42 face each other in the reaction chamber 2, and a reactive gas flows on the substrate W in a horizontal direction in the reaction chamber 2.

An annular placing table 45 is provided on the lower surface side of the lower sidewall portion 32 of the sidewall portion 4, and the sidewall portion 4 is placed on the placing table 45.

An annular clamping portion 51 is provided on the outer circumferential side of the ceiling portion 5, the sidewall portion 4, and the placing table 45, and the annular clamping portion 51 clamps and supports the ceiling portion 5, the sidewall portion 4 and the placing table 45. The clamping portion 51 is provided with a communication passage 52 on the supply side that communicates with the reactive gas supply passage 41 and a communication passage 53 on the exhaust side that communicates with the gas exhaust passage 42. A gas introduction tube 55 is inserted into the communication passage 52 on the supply side. In addition, a gas exhaust tube 58 is inserted into the communication passage 53 on the exhaust side.

The reactive gas introduction portion 54 is provided on the outside of the clamping portion 51, and the reactive gas introduction portion 54 and the communication passage 52 on the supply side communicate with each other. In the present embodiment, a first raw material gas and a second raw material gas are introduced from the reactive gas introduction portion 54. Meanwhile, the second raw material gas also functions as a carrier gas. As a reactive gas, a gas obtained by mixing three or more kinds of gases can also be used. The connection portion between the communication passage 52 on the supply side and the reactive gas introduction portion 54 is provided with a flow straightening plate 56 so as to be perpendicular to a gas passage. The flow straightening plate 56 is provided with a plurality of hole portions 56a arranged in a low along the circumferential direction, and the reactive gas passes through the hole portions 56a. Therefore, the first raw material gas and the second raw material gas are mixed and straightened. In addition, a gas exhaust portion 57 is further provided on the outside of the clamping portion 51. The gas exhaust portion 57 is provided at a position facing the reactive gas introduction portion 54 with the center of the reaction chamber 2 interposed therebetween. The gas exhaust portion 57 and the communication passage 53 on the exhaust side communicate with each other. That is, the reactive gas introduction portion 54 is connected to the reactive gas supply passage 41 through the communication passage 52 on the supply side. In addition, the gas exhaust portion 57 is connected to the gas exhaust passage 42 through the communication passage 53 on the exhaust side. The gas exhaust passage 42 is provided so as to face the reactive gas supply passage 41 with the center of the reaction chamber 2 interposed therebetween.

In addition, a bottom 61 of the apparatus is provided on the lower portion on the inner circumferential side of the placing table 45. Another heating means 62 and the lower reflector 65 are provided on the outside of bottom 61 of the apparatus, and can heat the substrate W from below.

A shank 63 of the susceptor support portion 100 is inserted in the center of the bottom 61 of the apparatus, and a purge gas introduction portion (not shown) into which a purge gas is introduced is provided therein. The purge gas is introduced into a lower portion 64 of the reaction chamber which is constituted by the bottom 61 of the apparatus, the lower sidewall portion 32 and the placing table 45, from purge gas introduction means, not shown, provided in the purge gas introduction portion.

The susceptor support portion 100 that supports the susceptor 20 from below is as described above.

Figure 5:
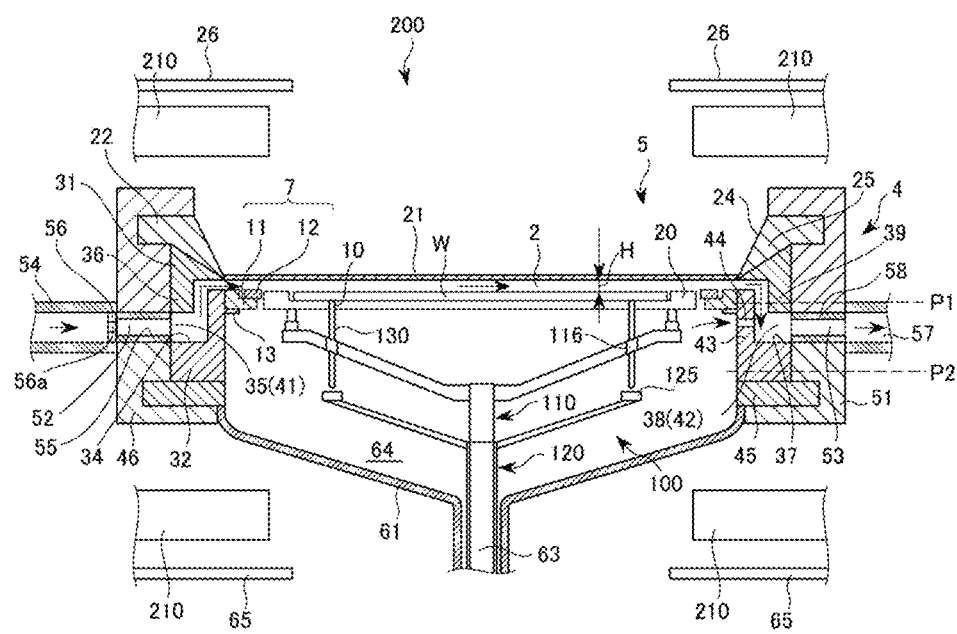
FIG. 5 is a schematic cross-sectional view of an epitaxial growth apparatus according to another embodiment of the present invention.
Figure 6:
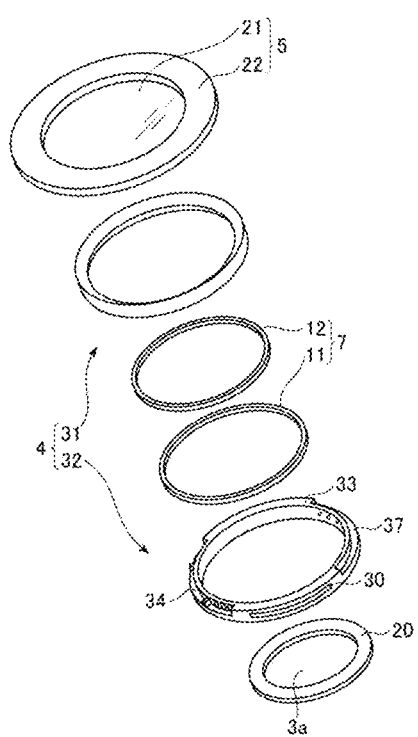
FIG. 6 is an exploded perspective view illustrating a configuration of a reaction chamber in the embodiment of the present invention.
Figure 7:
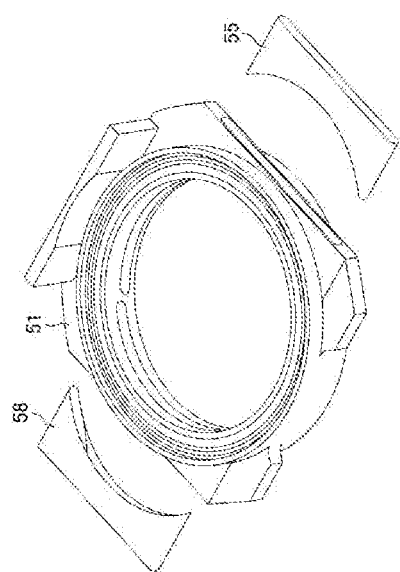
FIG. 7 is an exploded perspective view illustrating an outer configuration of the reaction chamber in the embodiment of the present invention.

The configuration of an epitaxial growth apparatus 200 according to another embodiment of the present invention will be described in detail with reference to FIGS. 5, 6 and 7. FIG. 5 is a cross-sectional view illustrating the entirety of the epitaxial growth apparatus 200. In addition, FIG. 6 is an exploded perspective view illustrating a configuration of the reaction chamber 2 according to the epitaxial growth apparatus 200, and FIG. 7 is an exploded perspective view illustrating an outer configuration of the reaction chamber 2 according to the epitaxial growth apparatus 200.

The epitaxial growth apparatus 200 is a film formation apparatus for epitaxial growing a film such as, for example, silicon on the substrate W.

The epitaxial growth apparatus 200 includes a reaction chamber 2. The reaction chamber 2 is constituted by the susceptor 20 on which the substrate W is placed, a sidewall portion 4, and a ceiling portion 5.

The susceptor 20 is a plate-like member having a circular shape in a top surface view, and is configured to be slightly larger than the substrate W. The susceptor 20 is provided with a concave portion 3a for a substrate for placing the substrate W. The susceptor 20 is supported by the susceptor support portion 100 having a plurality of arms.

The susceptor support portion 100 elevates the susceptor 20 while supporting the susceptor 20. The elevation range of the surface of the susceptor 20 on which the substrate W is placed is susceptor 20 is a range from a film forming position P1 at which film formation is performed on the substrate W to a substrate conveying position P2 at which the substrate W is transferred into and from the epitaxial growth apparatus 200. The susceptor support portion 100 is configured to rotate at the film forming position P1 using the axis of the susceptor support portion 100 as the center of rotation, thereby allowing the susceptor 20 and the substrate W to be rotated.

The susceptor 20 is configured such that an annular susceptor ring 7 is disposed in its periphery at a film forming position P1. The susceptor ring 7, of which the details will be described later, is constituted by a first ring 11 and a second ring 12 placed on the first ring 11. The susceptor ring 7 is supported by a flange portion 13 provided in the sidewall portion 4 of the reaction chamber 2.

The ceiling portion 5 is constituted by a ceiling plate 21 and a support portion 22 that supports the ceiling plate 21. The ceiling plate 21 has permeability, and is configured to be capable of heat the inside of the reaction chamber 2 by transmitting heat from the heating means 210 (for example, halogen lamp) and an upper reflector 26 which are provided above the outside of the ceiling plate 21. That is, the epitaxial growth apparatus 200 in the present embodiment is a cold wall-type epitaxial growth apparatus. In the present embodiment, quartz is used as the ceiling plate 21.

The support portion 22 that supports the ceiling plate 21 is annular. The ceiling plate 21 is fixed to the end of a through hole 24 on the substrate W side which is located further inside than the inner edge of the support portion 22. A fixing method includes welding.

The sidewall portion 4 is constituted by an annular upper sidewall portion 31 and an annular lower sidewall portion 32. The above-mentioned flange portion 13 is provided on the inner circumferential side of the lower sidewall portion 32. A substrate conveying port 30 is provided at the side located further down than the flange portion 13. The upper sidewall portion 31 has an inclined plane, corresponding to an outer inclined plane of a protruding portion 25 of the support portion 22, on its upper surface. The support portion 22 is disposed on the inclined plane of the upper sidewall portion 31.

The upper surface of the lower sidewall portion 32 is configured such that a portion of the outer circumferential portion is notched, and a region in which the notch is provided is formed as a placing surface 33 on which the upper sidewall portion 31 is placed. A first concave portion 34 is formed in the lower sidewall portion 32 by the notch of the lower sidewall portion 32. That is, the first concave portion 34 is a concave portion formed in a portion in which the placing surface 33 on the upper surface of the lower sidewall portion 32 is not formed. The upper sidewall portion 31 is provided with a first convex portion 36 so that the convex portion corresponds to the shape of the first concave portion 34 at a position corresponding to the first concave portion 34 during placement on the lower sidewall portion 32, and that a gap 35 is formed between the convex portion and the first concave portion 34. The gap 35 between the first convex portion 36 and the first concave portion 34 functions as a reactive gas supply passage 41 (supply passage). The details of the reactive gas supply passage 41 will be described later.

In addition, in a region facing the first concave portion 34 of the lower sidewall portion 32, the upper surface of the lower sidewall portion 32 is configured such that a portion of its outer circumferential portion is notched and a second concave portion 37 is formed. The upper sidewall portion 31 is provided with a second convex portion 39 so that the convex portion corresponds to the shape of the second concave portion 37 at a position corresponding to the second concave portion 37 during placement on the lower sidewall portion 32, and that a gap 38 is formed between the convex portion and the second concave portion 37. A gas exhaust passage 42 is formed between the second concave portion 37 and the second convex portion 39 of the upper sidewall portion 31.

In this manner, the reactive gas supply passage 41 and the gas exhaust passage 42 face each other in the reaction chamber 2, and a reactive gas flows on the substrate W in a horizontal direction in the reaction chamber 2.

In addition, a purge hole 44 through which a purge gas is exhausted is formed in a wall surface 43 constituting the second concave portion 37 of the lower sidewall portion 32. The purge hole 44 is provided below the flange portion 13. The purge hole 44 is provided in the wall surface 43 constituting the second concave portion 37, and thus the purge hole 44 fronts on the gas exhaust passage 42. Therefore, both the reactive gas and the purge gas are exhausted from the gas exhaust passage 42.

An annular placing table 45 is provided on the lower surface side of the lower sidewall portion 32 of the sidewall portion 4, and the sidewall portion 4 is placed on the placing table 45.

An annular clamping portion 51 is provided on the outer circumferential side of the ceiling portion 5, the sidewall portion 4, and the placing table 45, and the annular clamping portion 51 clamps and supports the ceiling portion 5, the sidewall portion 4 and the placing table 45. The clamping portion 51 is provided with a communication passage 52 on the supply side that communicates with the reactive gas supply passage 41 and a communication passage 53 on the exhaust side that communicates with the gas exhaust passage 42. A gas introduction tube 55 is inserted into the communication passage 52 on the supply side. In addition, a gas exhaust tube 58 is inserted into the communication passage 53 on the exhaust side.

The reactive gas introduction portion 54 is provided on the outside of the clamping portion 51, and the reactive gas introduction portion 54 and the communication passage 52 on the supply side communicate with each other. In the present embodiment, a first raw material gas and a second raw material gas are introduced from the reactive gas introduction portion 54. Meanwhile, the second raw material gas also functions as a carrier gas. As a reactive gas, a gas obtained by mixing three or more kinds of gases can also be used. The connection portion between the communication passage 52 on the supply side and the reactive gas introduction portion 54 is provided with a flow straightening plate 56 so as to be perpendicular to a gas passage. The flow straightening plate 56 is provided with a plurality of hole portions 56a arranged in a low along the circumferential direction, and the reactive gas passes through the hole portions 56a. Therefore, the first raw material gas and the second raw material gas are mixed and straightened. In addition, a gas exhaust portion 57 is further provided on the outside of the clamping portion 51. The gas exhaust portion 57 is provided at a position facing the reactive gas introduction portion 54 with the center of the reaction chamber 2 interposed therebetween. The gas exhaust portion 57 and the communication passage 53 on the exhaust side communicate with each other. That is, the reactive gas introduction portion 54 is connected to the reactive gas supply passage 41 through the communication passage 52 on the supply side. In addition, the gas exhaust portion 57 is connected to the gas exhaust passage 42 through the communication passage 53 on the exhaust side. The gas exhaust passage 42 is provided so as to face the reactive gas supply passage 41 with the center of the reaction chamber 2 interposed therebetween.

In addition, a bottom 61 of the apparatus is provided on the lower portion on the inner circumferential side of the placing table 45. Another heating means 62 and the lower reflector 65 are provided on the outside of bottom 61 of the apparatus, and can heat the substrate W from below.

A shank 63 of the susceptor support portion 100 is inserted in the center of the bottom 61 of the apparatus, and a purge gas introduction portion (not shown) into which a purge gas is introduced is provided therein. The purge gas is introduced into a lower portion 64 of the reaction chamber which is constituted by the bottom 61 of the apparatus, the lower sidewall portion 32 and the placing table 45, from purge gas introduction means, not shown, provided in the purge gas introduction portion. In addition, the purge hole 44 communicates with the lower portion 64 of the reaction chamber.

Outline of Growth Method Using Epitaxial Growth

Next, a growth method using the epitaxial growth apparatus according to the present embodiment will be described.

First, the susceptor 20 is moved up to the substrate conveying position P2, the substrate W is carried in from the substrate conveying port 30, and the susceptor 20 is moved up to the film forming position P1. As the substrate W, a silicon substrate having a diameter of, for example, 200 mm is used. Next, the substrate is heated from standby temperature (for example, 800° C.) to growth temperature (for example, 1100° C.) by the heating means 210. A purge gas (for example, hydrogen) is introduced from the purge gas introduction portion into the lower portion 64 of the reaction chamber. In addition, a reactive gas (for example, trichlorosilane as the first raw material gas, and hydrogen as the second raw material gas) is introduced from the reactive gas introduction portion 54 through the reactive gas supply passage 41 into the reaction chamber 2. The reactive gas forms a boundary layer on the surface of the substrate W, and reaction occurs in the boundary layer. Thereby, a silicon film is formed on the substrate W. The reactive gas is exhausted from the gas exhaust passage 42 which fronts on the reaction chamber 2. In addition, the purge gas is exhausted to the gas exhaust passage 42 through the purge hole 44. In this manner, after the epitaxial growth is terminated, temperature is reduced up to the standby temperature. The substrate W is then carried out, and is moved to another chamber of a semiconductor manufacturing apparatus.

Details of Epitaxial Growth Apparatus and Method

Next, the details of components of the epitaxial growth apparatus 200 according to the present embodiment will be described, and the details of a growth method according to the present embodiment will also be described.

Figure 8:
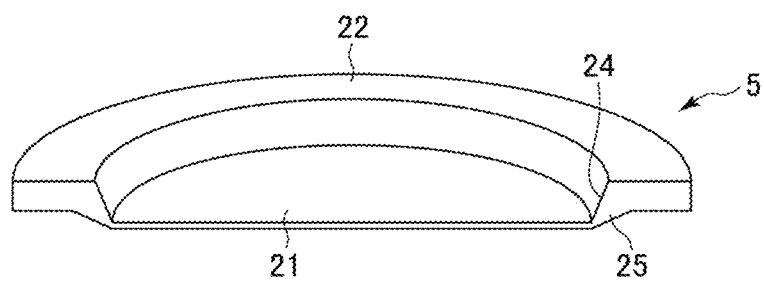
FIG. 8 is an exploded cross-sectional view illustrating a configuration of a ceiling portion in the embodiment of the present invention.
Figure 9:
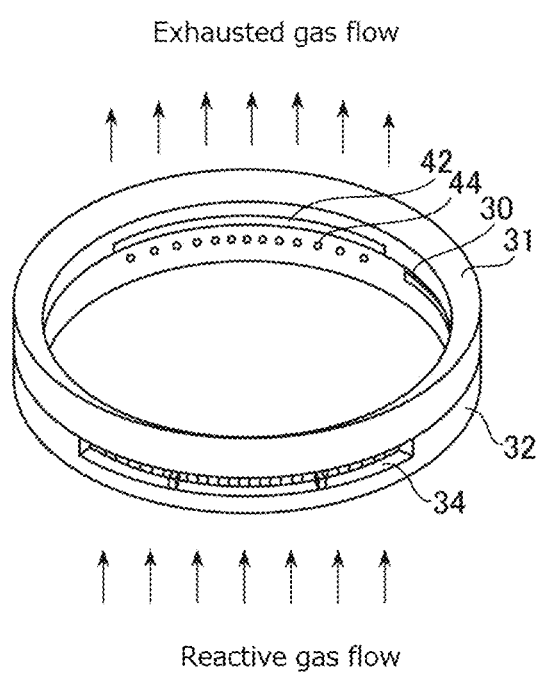
FIG. 9 is a schematic diagram illustrating an inner configuration of a sidewall portion in the embodiment of the present invention.
Figure 10:
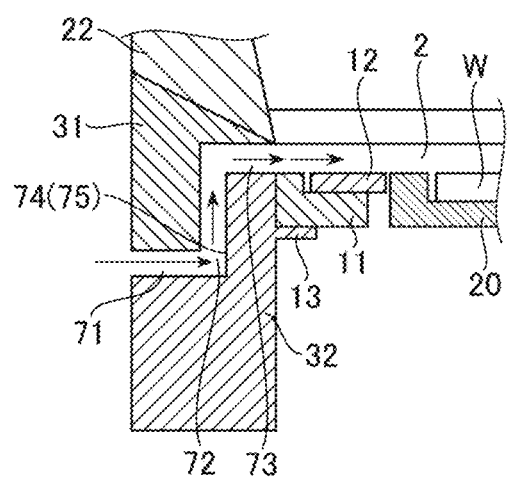
FIG. 10 is a cross-sectional view illustrating a reactive gas supply passage in the embodiment of the present invention.
Figure 11:
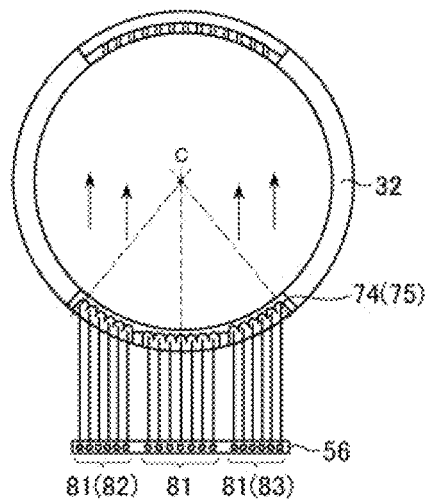
FIGS. 11A and 11B are schematic diagrams illustrating the reactive gas supply passage in the embodiment of the present invention.
Figure 11:
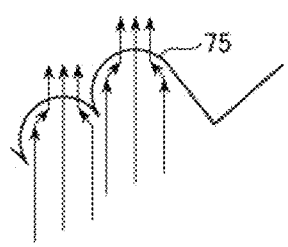
Figure 20:
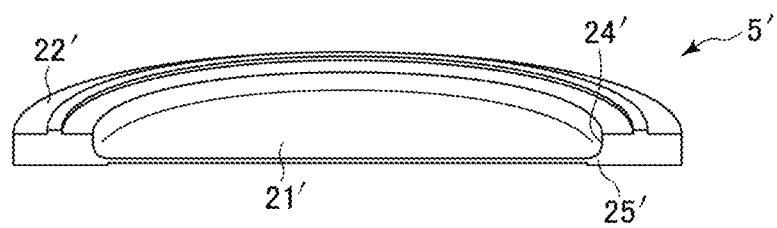
FIG. 20 is an exploded cross-sectional view illustrating a configuration of a ceiling portion in an epitaxial growth apparatus of the related art.

FIG. 8 is an exploded cross-sectional view illustrating a configuration of the ceiling portion 5 in the present embodiment. As shown in the drawing, the inner edge of the support portion 22 that supports the ceiling plate 21 gradually decreases in diameter toward the substrate side. The ceiling plate 21 is fixed to the end of the inner edge on the substrate W side. In addition, when the support portion 22 is seen from the rear surface side (lower surface side), the inner circumferential portion protrudes and is formed as the protruding portion 25. The protruding portion 25 is also formed so as to gradually decrease in diameter toward a protruding direction. In this manner, the support portion 22 is constituted by two inclined planes. That is, in the peripheral portion of the ceiling plate 21, the support portion 22 supports the ceiling plate 21 from the upper and outer sides of the peripheral portion. On the other hand, FIG. 20 is an exploded cross-sectional view illustrating an example of a ceiling portion 5' of an epitaxial growth apparatus of the related art. As shown in the drawing, in the ceiling portion 5' of the apparatus of the related art, a support portion 22' supports a ceiling plate 21' from the same plane as the ceiling plate 21', in the peripheral portion of the ceiling plate 21', and the support portion 22' is formed in a shape having a substantially right-angled corner 25'.

In this manner, in the present embodiment, the support portion 22 is formed in a shape which is not likely to concentrate stress as compared to that of the related art, and thus a distance H between the substrate W and the ceiling plate 21 can be set to be short, that is, less than 10 mm.

Specifically, most of infrared rays from the heating means 210 pass through the ceiling plate 21 (21'), but the ceiling plate 21 (21') itself absorbs radiant heat from the susceptor 20 or the substrate W. This absorbed heat is input from the ceiling plate 21 (21') through the junction with the support portion 22 (22') to the support portion 22 (22'). Here, when the distance H between the substrate W and the ceiling plate 21 (21') is shortened, the amount of the radiant heat absorbed increases, and a great deal of heat which is input to the support portion 22 (22') occurs. Therefore, as in the ceiling portion 5' of the related art, when the support portion 22' has the substantially right-angled corner 25', stress is concentrated in the corner 25', and thus there is a concern that a crack or the like may be generated.

In the other hand, in the present embodiment, the support portion 22 is provided with the protruding portion 25, and in the peripheral portion of the ceiling plate 21, the ceiling plate 21 is supported from the upper and outer sides of the peripheral portion. Therefore, the ceiling plate 21 can be supported at the substrate side without providing the corner (25') having a tendency to concentrate stress, insofar as possible.

In addition, in the present embodiment, the distance H between the ceiling plate 21 and the substrate W is shortened in order to narrow the boundary layer as mentioned above, and thus the reactive gas has a tendency to escape the outside of the substrate W. In addition, since a case where it is difficult to uniform the distribution of film thickness in the substrate is considered, it is preferable to prevent this case. For this reason, in the present embodiment, the reactive gas supply passage 41 is provided with a guide portion in order to uniform a gas flow, as described below.

The guide portion provided in the reactive gas supply passage 41 will be described in detail with reference to FIG. 9 to FIGS. 11A and 11B. As mentioned above, the reactive gas supply passage 41 is formed of the first concave portion 34 of the lower sidewall portion 32 and the first convex portion 36 of the upper sidewall portion 31, and communicates up to the reactive gas introduction portion 54 through the gas introduction tube 55 within the communication passage 52 on the supply side. In addition, the reactive gas supply passage 41 includes a first supply passage 71 that extends in a direction (horizontal direction) consistent with the introduction direction of a gas from the reactive gas introduction portion 54, a second supply passage 72 that communicates with the first supply passage 71 and extends in a direction (vertical direction) perpendicular to the introduction direction of a gas, and a third supply passage 73 that communicates with the second supply passage 72 and extends in a direction (horizontal direction) consistent with the introduction direction of a gas. The third supply passage 73 communicates with the reaction chamber 2. That is, the reactive gas supply passage 41 is formed in an ascending stepwise shape toward an outlet connected from the communication passage 52 on the supply side which is an inlet of the reactive gas to the reaction chamber 2 which is an outlet of the reactive gas.

Here, the second supply passage 72 extends in a vertical direction as mentioned above, and thus the gas introduced from the reactive gas introduction portion comes into contact with a wall surface 74 facing the reactive gas introduction portion 54 of the second supply passage 72. Thereby, the reactive gas is diffused, and the miscibility of the reactive gas increases. That is, the second supply passage 72 functions as a mixing chamber of the reactive gas. In this case, in the present embodiment, a groove portion 75 extending in a vertical direction is formed in the wall surface 74 of the second supply passage 72 so that the reactive gas does not stagnates in the second supply passage 72, and the groove portion 75 functions as the guide portion. In this manner, the groove portion 75 is provided, and thus the gas diffused by coming into contact with the wall surface 74 of the second supply passage 72 also has a tendency to flow into the third supply passage 73. Further, the gas is straightened along the groove portion 75, and thus it is possible to improve the straightness of the reactive gas, and to suppress the spread of the reactive gas when the gas flows into the reaction chamber 2.

The groove portion 75 will be described in detail. A plurality of groove portions 75 are continuously formed as concave portions in the entire wall surface 74 of the second supply passage 72. As shown in FIG. 11A, the groove portion 75 which is a concave portion is curved in the width direction of the groove portion 75. In the present embodiment, the groove portion 75 is arc-shaped in a top surface view. When the reactive gas comes into contact with the bottom of the groove portion 75 of the wall surface 74 due to the curvature of the groove portion 75 in the width direction, the reactive gas is not easily diffused (is easily concentrated). Even when the reactive gas flows into the reaction chamber 2, the reactive gas is not easily spread to the outside of the substrate W. Meanwhile, when the depth of the groove portion 75 is excessively large, the diffusion thereof can be suppressed, but it is difficult to mix the first raw material gas with the second raw material gas in the reactive gas. In one embodiment of the present invention, the depth of the groove portion 75 is preferably set to 1 mm to 5 mm. Further, the depth is more preferably set to 3 mm.

In addition, each of the groove portions 75 is provided so as to be directed to the center C of the lower sidewall portion 32 in the in-plane direction. That is, the groove portion 75 is provided along the circumferential direction of the lower sidewall portion 32. By providing the groove portion in this manner, a straightening property is improved so that a component in the horizontal direction toward the flow of the reactive gas which is guided by each of the groove portions 75 and is introduced into the reaction chamber 2 is consistent with a component in the horizontal direction from the center of an aperture of the reactive gas supply passage 41 on the reaction chamber 2 side toward the center of the reaction chamber 2, and the dispersion of the reactive gas into the reaction chamber 2 is suppressed.

Further, each groove portion 75 is provided at a position in which the center of each groove portion 75 in the width direction and the center of the hole portion 56a of the flow straightening plate 56 provided in the reactive gas introduction portion 54 are substantially consistent with (correspond to) each other. That is, in the present embodiment, the number of groove portions 75 and the number of hole portions 56a in the wall surface 74 are consistent with each other. Thereby, since the reactive gas straightened by the flow straightening plate 56 flows to the each groove portion 75 as it is, flow straightening action further increases, and thus the straightness of the reactive gas can be improved.

Meanwhile, in the present embodiment, the groove portions 75 are provided in the entire wall surface 74 of the second supply passage 72, but may be provided in at least the end portion in the wall surface 74 of the second supply passage 72. The end portion means a portion corresponding to an endmost region of a plurality of regions into which the hole portion of the flow straightening plate 56 is divided. For example, in a case of FIG. 11B, the flow straightening plate 56 is divided into three regions 81, the groove portions 75 may be provided corresponding to the hole portions of endmost regions 82 and 83 in the regions. As mentioned above, the reactive gas has a tendency to escape to the outside of the substrate W, and thus it is preferable to provide the groove portion 75 in order to improve the straightness of the reactive gas, particularly, in the end portion of the reactive gas supply passage 41. In this case, the groove portion 75 functioning as the guide portion is formed as a concave portion, thereby allowing such an effect to be easily obtained. For example, when a straightening member is separately provided in the second supply passage 72, problems such as the miscibility of the reactive gas and a manufacturing cost occurs. However, as in the present embodiment, the groove portion 75 is formed as a concave portion, and thus these problems are solved.

Figure 12:
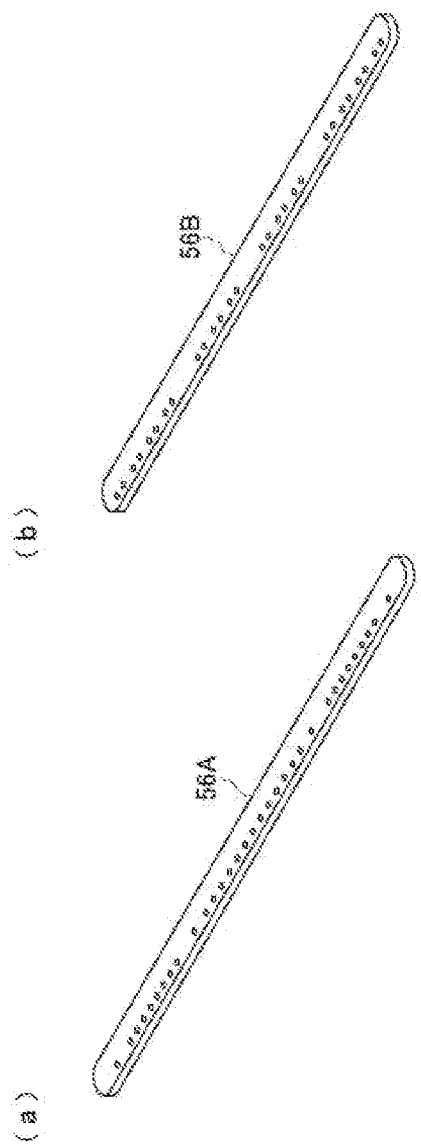
FIGS. 12A and 12B are perspective views illustrating an example of a flow straightening plate in the embodiment of the present invention.

FIGS. 12A and 12B are perspective views illustrating an example of the flow straightening plate 56. As shown in the drawings, as the flow straightening plate 56, a plate corresponding to a pattern of the groove portion 75 may be prepared. The numerical aperture of the flow straightening plate 56 is preferably determined to be an optimum value including not only the viewpoint of a growth rate, but also incidental fittings such as a scrubber or the shape and length of outer piping.

In the present embodiment, the distance between the ceiling plate 21 and the substrate W is narrowed in order to narrow the boundary layer as mentioned above, and thus it is considered that the wrapping around of the reactive gas to the lower portion of the reaction chamber 2 has a tendency to occur, and the temperature distribution of the substrate W is not likely to be uniformed. As a result, the distribution of film thickness or the deterioration in film quality during the formation of a thick film (for example, the distribution of resistivity, the occurrence of a crystal defect, or the like) is also considered. In the present embodiment, the susceptor ring 7 is constituted by two members in order to prevent this. Such a point will be described below.

Figure 13:
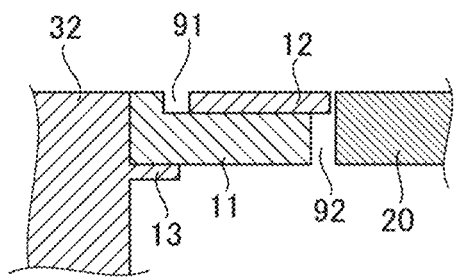
FIG. 13 is a partial cross-sectional view illustrating an example of a susceptor ring in the embodiment of the present invention.

As enlargedly shown in FIG. 13, the first ring 11 constituting the susceptor ring 7 is separated from the outer circumference of the susceptor, a stepped portion 91 having a low upper surface is formed on the inner circumferential side of the first ring. The second ring 12 is placed on the stepped portion 91. The second ring 12 fronts on a separation portion 92 formed between the first ring 11 and the susceptor 20, that is, is provided so as to protrude to the separation portion 92. The upper surface of the second ring 12 is provided so as to be equal to the upper surface of the susceptor 20. In this manner, the upper surface of the second ring 12 is provided so as to be equal to the upper surface of the susceptor 20, and thus a reactive gas maintained in a state where the gas is mixed and straightened in the reactive gas supply passage 41 or the like can be smoothly supplied to the substrate W without lowering its velocity insofar as possible. Meanwhile, the term "upper surface of the susceptor 20" as used herein means an upper surface of a region in which the concave portion 3a for a substrate of the susceptor 20 (see FIGS. 5, 6, 15, and 16) is not formed. In the second ring 12 of the present embodiment, silicon carbide is used as a material in view of thermal conductivity.

In this manner, the second ring 12 and the first ring 11 are formed as different members, and thus the susceptor ring 7 can be formed with a higher degree of accuracy. That is, the distance between the susceptor ring 7 and the susceptor 20 can be brought close to the limit. Thereby, it is possible to reduce the wrapping around of the reactive gas to the rear surface side of the substrate W, that is, the lower portion 64 of the reaction chamber, and to uniform the temperature distribution of the substrate W. Thereby, in the present embodiment, the thickness distribution of the formed film or the distribution of film quality is uniformed.

In addition, two members of the first ring 11 and the second ring 12 are formed, and thus the transfer of heat between the first ring 11 and the second ring 12 can be further suppressed than in a case where the first ring 11 and the second ring 12 are formed as one member.

Further, in this manner, the second ring 12 is formed so as to front on the separation portion 92, and thus it is possible to reduce the leakage of the reactive gas downward from between the susceptor ring 7 and the susceptor 20 during the film formation. Therefore, the flow of the reactive gas is not likely to be disturbed, and it is possible to reduce the leakage of the reactive gas downward, thereby allowing the number of particles to be reduced.

In this case, the second ring 12 is formed to be thinner than the first ring 11. Thereby, it is possible to suppress a heat loss due to radiation from the susceptor 20. In addition, the second ring 12 is formed to be thin, and thus it is possible to reduce the amount of heating required for maintaining (pre-heating) the second ring 12 at a predetermined high temperature. As another embodiment, when the first ring 11 is formed as a material having a low thermal conductivity, the first ring 11 functions as a heat insulating material, and thus it is possible to further improve the above-mentioned effect.

Meanwhile, in the present embodiment, the second ring 12 is formed so as to front on the separation portion 92, but is not limited thereto. When the second ring 12 is formed so as to be placed at least on the stepped portion 91 of the first ring 11, the susceptor ring 7 can be formed with a high degree of accuracy, and thus the distance between the susceptor ring 7 and the susceptor 20 can be brought close to the limit. Thereby, it is possible to reduce the wrapping around of the reactive gas to the rear surface side of the substrate W, and to uniform the temperature distribution of the substrate.

In addition, in the present embodiment, since the distance between the ceiling plate 21 and the substrate W is narrowed in order to narrow the boundary layer, the ceiling surface of the ceiling plate 21 is also easily coated by the reactive gas. When the ceiling surface is coated, the ceiling surface becomes dim, and thus there is a concern that a film cannot be sufficiently formed in a cold wall-type epitaxial growth apparatus that performs heating from the heating means 210 through the ceiling plate 21. On the other hand, in the present embodiment, the groove portion 75 is provided in the wall surface of the reactive gas supply passage 41 as mentioned above, and the susceptor ring 7 is constituted by two members. Therefore, the reactive gas is not likely to stagnate in the reaction chamber 2, and as a result, the adhesion of a coating material can be suppressed. Thereby, it is possible to continuously perform sufficient film formation.

Figure 14:
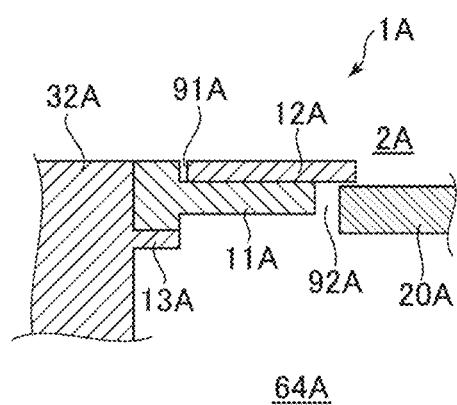
FIG. 14 is a partial cross-sectional view illustrating another example of the susceptor ring in the embodiment of the present invention.

FIG. 14 is a diagram illustrating a modified example of the susceptor ring 7. The modified example is different from the embodiment shown in FIG. 13, in that a second ring 12A is provided so as to cover a separation portion 92A. In the modified example, the first ring 11A is also placed on a flange portion 13A of a sidewall portion 32A. The second ring 12A is placed on a stepped portion 91A of the first ring 11A, and the inner circumferential side thereof fronts on the outer circumference of a susceptor 20A.

In the modified example, the second ring 12A is provided so as to cover the separation portion 92A, and thus it is possible to further suppress the entrance of the reactive gas flowing to the reaction chamber 2A into a lower portion 64A of the reaction chamber. However, in order to suppress causing the second ring 12A to block heating from heating means 210 which is not shown in the FIG. 14 to the susceptor 20A, the overlap amount of the second ring 12A and the susceptor 20A is preferably small.

In the modified example, the thickness of the second ring 12A is preferably set to, for example 0.5 mm to 2 mm. Further, the thickness is more preferably set to approximately 0.8 mm. The second ring is formed to have such a thickness, and thus it is possible to suppress a heat loss radiation from the susceptor 20A to the second ring 12A, insofar as possible.

Figure 15:
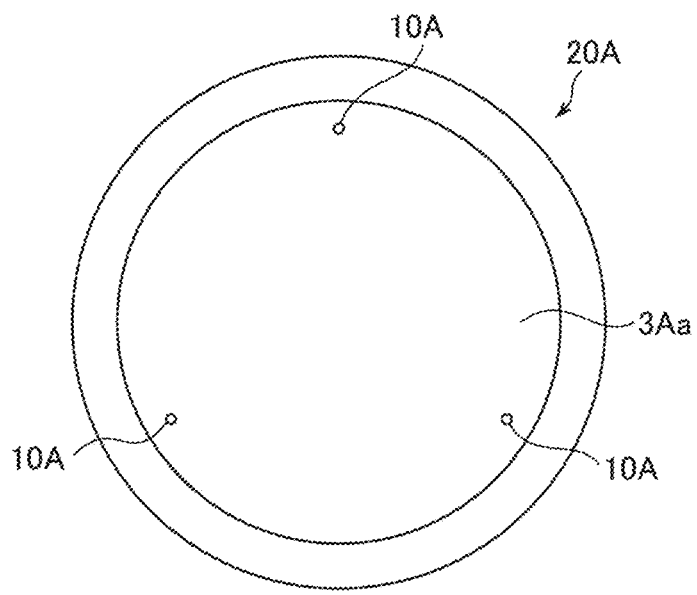
FIG. 15 is a plan view illustrating an example of a susceptor in the embodiment of the present invention.
Figure 16:
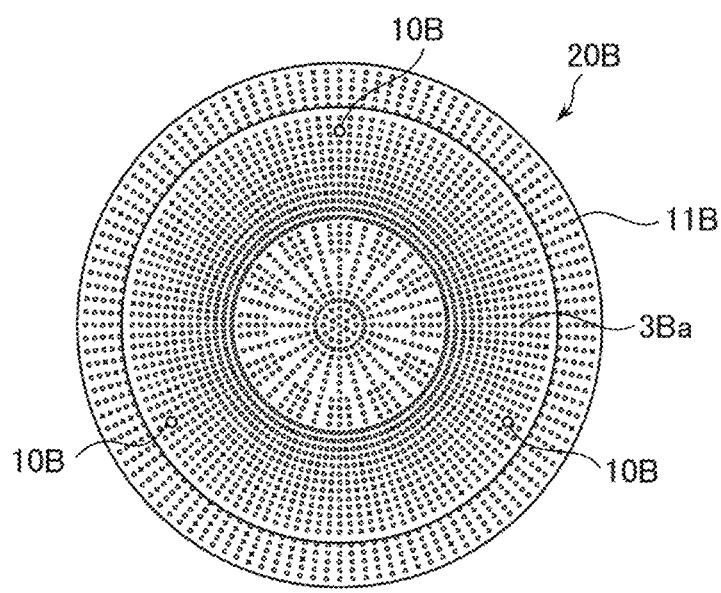
FIG. 16 is a plan view illustrating another example of the susceptor in the embodiment of the present invention.

FIGS. 15 and 16 are plan views illustrating an example of the susceptor 20 in the embodiment of the present invention. As shown in the drawings, the susceptor 20 is provided with through holes 10A and 10B for a lift pin through which the lift pin 130 passes. In addition, as shown in FIG. 16, a large number of through holes 11B may be included. A gas interposed at the moment when the substrate is placed on the susceptor can be let out by through holes 11B, and thus a problem that the substrate W slides in a horizontal direction can be solved. In addition, a case where such a susceptor 20B is used has an advantage over a case where the susceptor 20A is used, in terms of the uniformity in the film thickness distribution of the substrate W or the uniformity in the resistivity distribution. This becomes more conspicuous the smaller diameter of the through hole 11B, and the more the number of through holes 11B. In addition, the numerical aperture is preferably set to exceed 4%, and the through holes 11B are more preferably provided not only in concave portions 3Ba for a substrate of the susceptor, but also in the periphery thereto.

Figure 17:
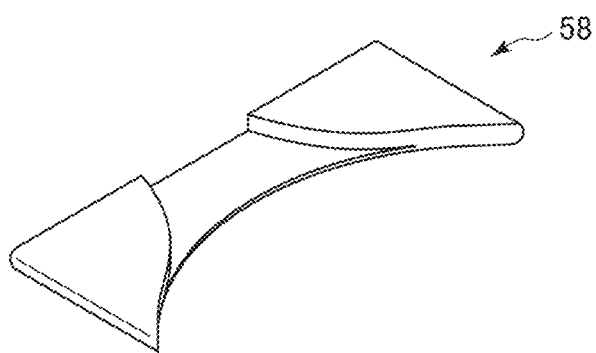
FIG. 17 is an exploded cross-sectional view illustrating an example of a gas exhaust tube in the embodiment of the present invention.

FIG. 17 is an exploded cross-sectional view illustrating an example of the gas exhaust tube 58 in the present embodiment. As shown in the drawing, the gas exhaust tube 58 is formed so that the aperture is narrowed toward the center as the tube moves from the reaction chamber 2 side toward the gas exhaust portion 57. Thereby, an exhaust gas is straightened at the center, and thus the improvement in exhaust efficiency is achieved.

Figure 21:
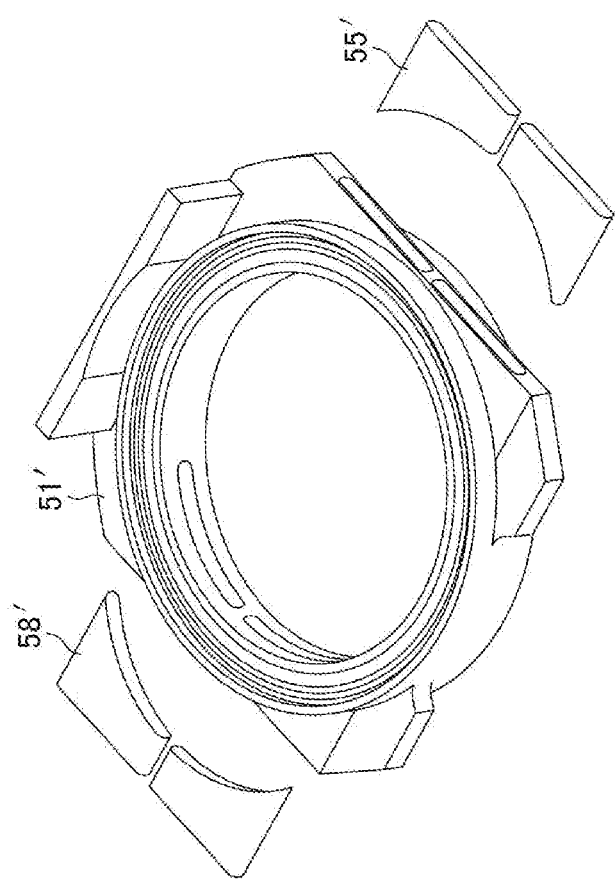
FIG. 21 is an exploded perspective view illustrating an outer configuration of a reaction chamber in the epitaxial growth apparatus of the related art.

In addition, FIG. 21 is an exploded perspective view of an outer configuration of the reaction chamber 2 in an epitaxial growth apparatus of the related art. As shown in the drawing, when the gas introduction tube 55 and the gas exhaust tube 58 are compared with a gas introduction tube 55' and a gas exhaust tube 58', respectively, a partition in each central portion is removed in the present embodiment. Thereby, the flow of a gas influencing the distribution of film thickness becomes smoothly.

Meanwhile, when the numerical apertures of the gas exhaust passage 42 and the purge hole 44 are excessively large, the reactive gas burrows into the lower portion 64 of the reaction chamber, and when the numerical apertures thereof are excessively small, the purge gas influences a film formation process within the reaction chamber 2. Therefore, the aperture is formed to have an optimum value.

Figure 18:
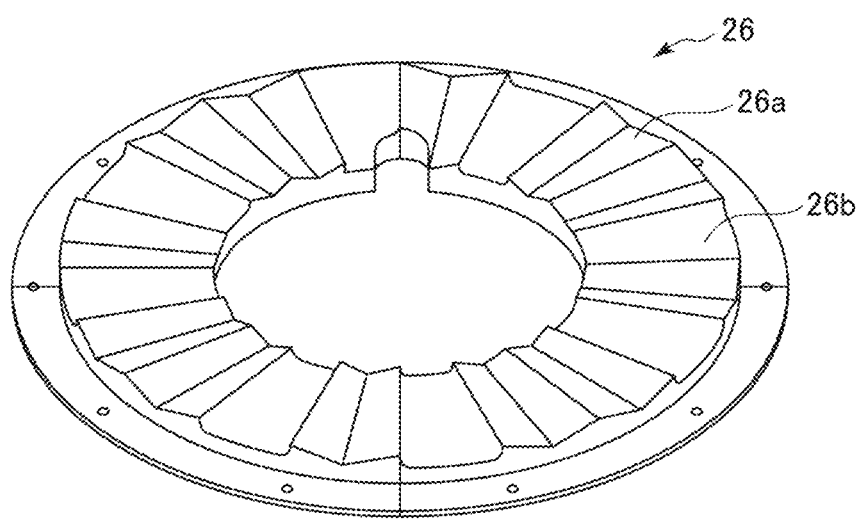
FIG. 18 is a perspective view illustrating an example of an upper reflector in the embodiment of the present invention.
Figure 22:
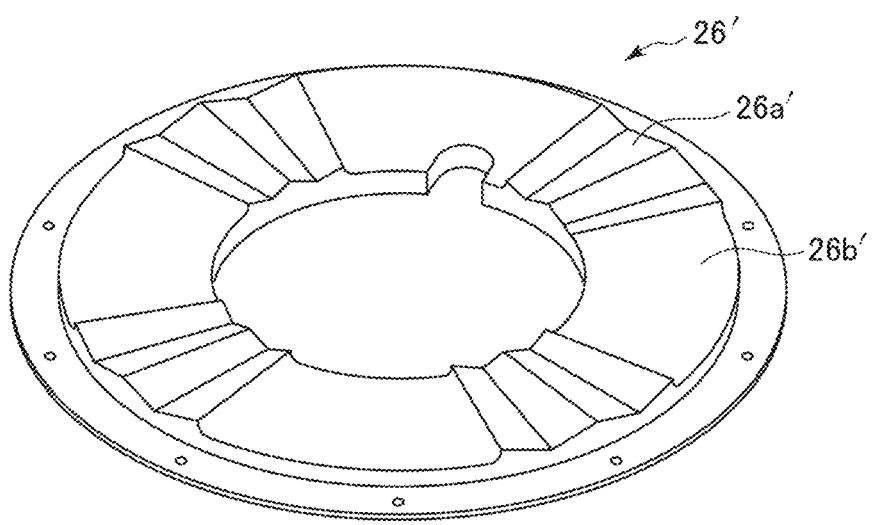
FIG. 22 is a perspective view illustrating an example of an upper reflector in the epitaxial growth apparatus of the related art.

FIG. 18 is a perspective view illustrating an example of the upper reflector 26 in the embodiment of the present invention. As shown in the drawing, the upper reflector 26 includes inclined portions 26a that reflect heat rays from the heating means 210 toward the center of the reaction chamber 2, and flattened portions 26b that reflect the heat rays from the heating means 210 in a vertically downward direction. On the other hand, FIG. 22 is a perspective view illustrating an example of an upper reflector 26' in the epitaxial growth apparatus of the related art. As shown in the drawing, the upper reflector 26' of the related art also includes inclined portions 26a' and flattened portion 26b', but is different from the upper reflector 26 according to the embodiment of the present invention in the arrangement of the inclined portions 26a. Specifically, the upper reflector 26 according to the embodiment of the present invention has an arrangement in which one inclined portion is added to the center of the flattened portion 26b' of the upper reflector 26' of the related art. In this manner, the inclined portion 26a and the flattened portion 26b are arranged so that the area ratio of the inclined portion 26a to the flattened portion 26b becomes a predetermined ratio, and that the distributions of the inclined portion 26a and the flattened portion 26b are not biased, and thus the uniformity in the temperature distribution of the substrate W is achieved.

Figure 19:
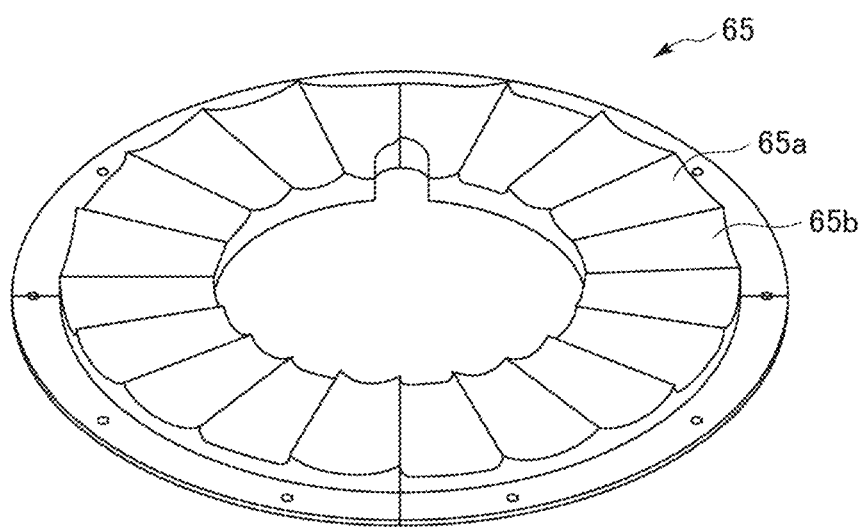
FIG. 19 is a perspective view illustrating an example of a lower reflector in the embodiment of the present invention.
Figure 23:
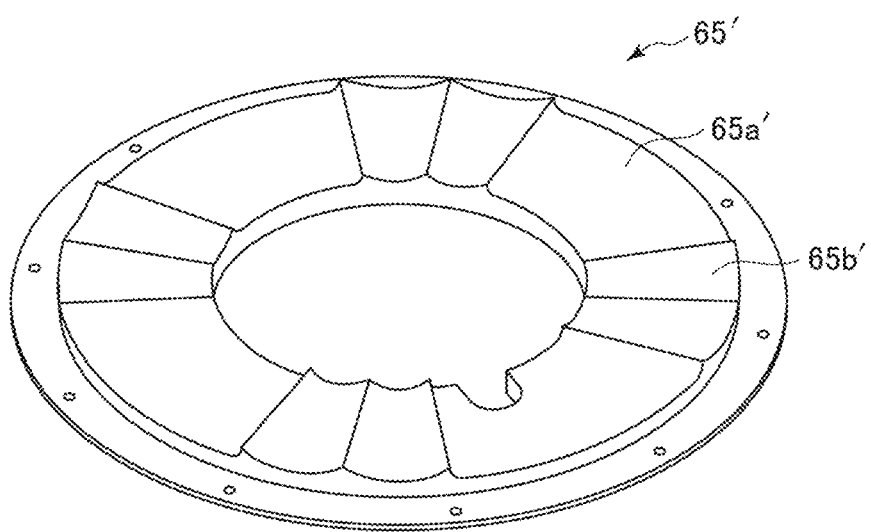
FIG. 23 is a perspective view illustrating an example of a lower reflector in the epitaxial growth apparatus of the related art.

FIG. 19 is a perspective view illustrating an example of the lower reflector 65 in the embodiment of the present invention. FIG. 23 is a perspective view illustrating an example of a lower reflector 65' in the epitaxial growth apparatus of the related art. Similarly to the upper reflector 26, the lower reflector 65 also includes inclined portions 65a that reflect heat rays from the heating means 62 toward the center of the reaction chamber 2, and flattened portions 65b that reflects the heat rays from the heating means 62 in a vertically upward direction, and has an arrangement in which one inclined portion is added to the center of a flattened portion 65b' of the lower reflector 65' of the related art. In this manner, the inclined portion 65a and the flattened portion 65b are arranged so that the area ratio of the inclined portion 65a to the flattened portion 65b becomes a predetermined ratio, and that the distributions of the inclined portion 65a and the flattened portion 65b are not biased, and thus the uniformity in the temperature distribution of the substrate W is achieved.

According to such a epitaxial growth apparatus of the present embodiment, the support portion 22 supports the ceiling plate 21, thereby allowing the distance H between the ceiling surface of the central portion of the ceiling plate 21 on the reaction chamber side and the substrate W to set to less than 10 mm. Thereby, the epitaxial growth apparatus 200 in the present embodiment can suppress the spreading of the boundary layer, formed by the reactive gas flowing between the ceiling plate 21 and the susceptor 20, to the ceiling side, and as a result, the boundary layer becomes narrow. Then, since a gas velocity within the boundary layer rises, a gas density improves as a result, and thus it is possible to increase reaction efficiency in the surface of the substrate W. Thereby, it is possible to improve a growth rate in the epitaxial growth apparatus 200.

Meanwhile, in one embodiment of the present invention, the distance H between the ceiling plate 21 and the substrate W is less than 10 mm, the distance H between the ceiling plate 21 and the substrate W is preferably less than 10 mm, and the distance between the surface of a film on which the substrate W is grown and the ceiling plate 21 is equal to or more than 1 mm. The distance is set to such a range, and thus the gas flow of the reactive gas can be smoothed while the boundary layer is formed.

That is, in the reaction chamber 2 in the present embodiment, the distance between the substrate W and the ceiling plate 21 is shorter than in the related art (approximately 20 mm in the related art). Therefore, reaction efficiency in the substrate surface is increased by narrowing the boundary layer, and as a result, a growth rate is improved.

Example 1

Using the susceptor support portion including the susceptor shaft and the substrate lift portion having the following sizes, an epitaxial film was grown on a semiconductor wafer under predetermined conditions.
Note
Susceptor Shaft
Width of First Arm: 3.3 mm
Width of Second Arm: 6.3 mm
Width of Third Arm: 3.2 mm
Diameter of Through Hole: 3.5 mm
Substrate Lift Portion
Width of First Arm: 4.8 mm
Width of Second Arm: 3.0 mm Comparative Example 1

Figure 24:
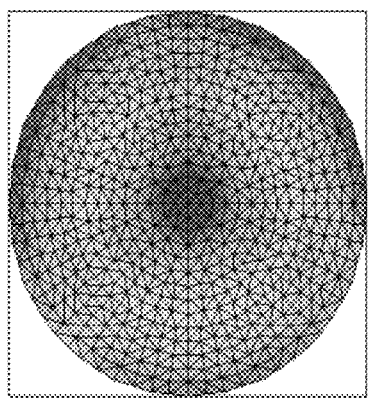
FIGS. 24A and 24B are graphs illustrating film thickness distributions of an epitaxial film according to Experimental Example 1 and comparative example 1.
Figure 24:
Figure 24:
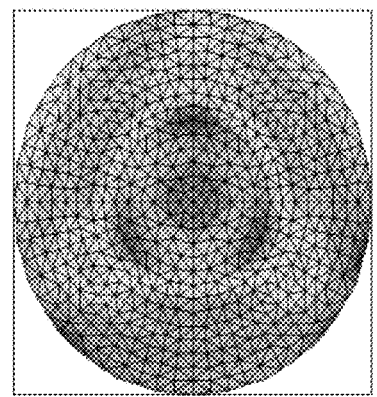
Figure 24:

Experiments were performed under the same conditions as those of Example 1, except other than using the susceptor support portion including the susceptor shaft and the substrate lift portion having the following sizes.
Note
Susceptor Shaft
Width of First Arm: 6.3 mm
Width of Second Arm: 6.3 mm
Width of Third Arm: 6.3 mm
Diameter of Through Hole: 3.5 mm
Substrate Lift Portion
Width of First Arm: 4.8 mm
Width of Second Arm: 4.8 mm FIG. 24A is a diagram illustrating a thickness distribution map of the epitaxial film of Example 1, and FIG. 24B is a diagram illustrating a thickness distribution map of the epitaxial film of Comparative Example 1. The Both are diagrams in which the film thickness is measured in 561 measurement points except for a range of 3 mm from the outer edge, and the distributions thereof are shown. A variation in the thickness of the epitaxial film of Example 1 shown in FIG. 24A was 0.67%, and a variation in the thickness of the epitaxial film of Comparative Example 1 shown in FIG. 24B was 1.31%. Therefore, it is known that the epitaxial film formed by the epitaxial growth apparatus using the susceptor shaft of the present invention of Example 1 has a more uniform distribution of film thickness than in Comparative Example 1.

What is claimed is:

1. A susceptor support portion supporting a susceptor from below, within an epitaxial growth apparatus that forms an epitaxial film on a surface of a semiconductor wafer placed on the susceptor having a through hole, the susceptor support portion comprising:
a susceptor shaft that supports the susceptor; and
a substrate lift portion that supports the semiconductor wafer,
wherein the susceptor shaft includes a support column and a plurality of arms that extend radially from the support column,
the substrate lift portion includes a support column and a plurality of arms that extend radially from the support column,
the arm of the susceptor shaft includes a first arm, a second arm coupled to the first arm, and a third arm coupled to the second arm, from the support column side of the susceptor support portion, the second arm being provided with a through hole which passes through the second arm in a vertical direction,
the arm of the substrate lift portion includes a first arm, a second arm coupled to the first arm, and a pedestal portion coupled to the second arm, from the support column side of the substrate lift portion,
a lift pin capable of passing through the through hole of the susceptor shaft and the through hole of the susceptor is provided between the pedestal portion of the substrate lift portion and the semiconductor wafer, and
a width of the first arm of the susceptor shaft is smaller than a width of the second arm of the susceptor shaft.

2. The susceptor support portion according to claim 1, wherein the width of the first arm of the susceptor shaft is equal to or less than a diameter of the through hole of the susceptor shaft.

3. The susceptor support portion according to claim 1, wherein a width of the third arm of the susceptor shaft is smaller than a width of the second arm of the susceptor shaft.

4. The susceptor support portion according to claim 3, wherein the width of the third arm of the susceptor shaft is equal to or less than the diameter of the through hole of the susceptor shaft.

5. The susceptor support portion according to claim 1, wherein a width of the second arm of the substrate lift portion is smaller than the width of the first arm of the substrate lift portion.

6. The susceptor support portion according to claim 1, wherein the width of the second arm of the substrate lift portion is the same as the width of the first arm of the susceptor shaft.

7. The susceptor support portion according to claim 1, wherein the support column of the susceptor shaft is provided with a cap that supports the susceptor.

8. The susceptor support portion according to claim 1, wherein the pedestal portion is provided with a concave portion capable of supporting a lower end of the lift pin.

9. An epitaxial growth apparatus forming an epitaxial film on a surface of a semiconductor wafer placed on a susceptor having a through hole, comprising:
a susceptor support portion that supports the susceptor from below,
wherein the susceptor support portion includes a susceptor shaft that supports the susceptor and a substrate lift portion that supports the semiconductor wafer,
wherein the susceptor shaft includes a support column and a plurality of arms that extend radially from the support column,
the substrate lift portion includes a support column and a plurality of arms that extend radially from the support column,
the arm of the susceptor shaft includes a first arm, a second arm coupled to the first arm, and a third arm coupled to the second arm, from the support column side of the susceptor shaft, the second arm being provided with a through hole which passes through the second arm in a vertical direction,
the arm of the substrate lift portion includes a first arm, a second arm coupled to the first arm, and a pedestal portion coupled to the second arm, from the support column side of the substrate lift portion,
a lift pin capable of passing through the through hole of the susceptor shaft and the through hole of the susceptor is provided between the pedestal portion of the substrate lift portion and the semiconductor wafer, and
a width of the first arm of the susceptor shaft is smaller than a width of the second arm of the susceptor shaft.

* * * * *

UNITED STATES PATENT AND TRADEMARK OFFICE
CERTIFICATE OF CORRECTION

PATENT NO.       : 8,888,087 B2
APPLICATION NO.  : 13/927553
DATED            : November 18, 2014
INVENTOR(S)      : Okabe et al.

It is certified that error appears in the above-identified patent and that said Letters Patent is hereby corrected as shown below:

In the Specification

Column 14, Line 17, please delete "mariner" and insert --manner-- therefor.

Signed and Sealed this
Twelfth Day of May, 2015

Michelle K. Lee
*Director of the United States Patent and Trademark Office*